(12) United States Patent
Seo et al.

(10) Patent No.: US 9,093,585 B2
(45) Date of Patent: Jul. 28, 2015

(54) ENCAPSULATION COMPOSITION FOR PHOTOVOLTAIC CELL MODULE AND PHOTOVOLTAIC CELL MODULE COMPRISING THE SAME

(71) Applicant: LG CHEM, LTD., Seoul (KR)

(72) Inventors: Beom Doo Seo, Daejeon (KR); Hoon Chae, Daejeon (KR); Choong Hoon Lee, Daejeon (KR); Sung Ho Choi, Seoul (KR); Seung Ki Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 87 days.

(21) Appl. No.: 13/902,450

(22) Filed: May 24, 2013

(65) Prior Publication Data

US 2013/0255756 A1    Oct. 3, 2013

Related U.S. Application Data

(63) Continuation of application No. PCT/KR2011/009090, filed on Nov. 25, 2011.

(30) Foreign Application Priority Data

Nov. 26, 2010 (KR) .................. 10-2010-0119060
Aug. 25, 2011 (KR) .................. 10-2011-0085187
Nov. 25, 2011 (KR) .................. 10-2011-0124475

(51) Int. Cl.
*H01L 31/048*   (2014.01)
*H01L 31/0203*  (2014.01)
*C08L 23/08*    (2006.01)
*H01L 23/29*    (2006.01)

(Continued)

(52) U.S. Cl.
CPC ......... *H01L 31/0481* (2013.01); *C08L 23/0815* (2013.01); *H01L 31/0203* (2013.01); *C08F 4/6592* (2013.01); *C08F 4/65908* (2013.01); *H01L 23/293* (2013.01); *Y02E 10/50* (2013.01)

(58) Field of Classification Search
CPC ........................ H01L 31/0481; H01L 31/0203
See application file for complete search history.

(56) References Cited

U.S. PATENT DOCUMENTS

2010/0069538 A1   3/2010   Kempe

FOREIGN PATENT DOCUMENTS

| CN | 101313049 A | 11/2008 |
|---|---|---|
| CN | 101421346 A | 4/2009 |
| CN | 101679561 A | 3/2010 |

(Continued)

OTHER PUBLICATIONS

Machine translation of Kim et al. (KR 10-2010-0123505).*

(Continued)

*Primary Examiner* — Ling Choi
*Assistant Examiner* — Catherine S Branch
(74) *Attorney, Agent, or Firm* — McKenna Long & Aldridge, LLP (57) ABSTRACT

The present application relates to an encapsulation composition and a photovoltaic cell module comprising the same, which may provide an encapsulation composition having excellent adhesivity of glass and modules with other members as well as excellent transparency, heat stability, ultraviolet stability and impact resistance. Therefore, the present application may provide a photovoltaic cell module that no peeling-off among elements, and the like, is caused, even when the module is used for a long time.

17 Claims, 1 Drawing Sheet

(51) Int. Cl.
*C08F 4/659* (2006.01)
*C08F 4/6592* (2006.01)

(56) References Cited

FOREIGN PATENT DOCUMENTS

| EP | 1956661 A1 | 8/2008 |
| JP | 2010-232457 | 10/2010 |
| JP | 2010-232457 A | 10/2010 |
| KR | 10-2010-0123505 | 11/2010 |
| KR | 1020100123505 A | 11/2010 |
| WO | 2004039852 A1 | 5/2004 |
| WO | WO 2007/061030 | 5/2007 |
| WO | WO 2007/119767 | 10/2007 |
| WO | 2008140205 A1 | 11/2008 |

OTHER PUBLICATIONS

Krevelen et al., Properties of Polymers: Their Correlation with Chemical Structure; their Numerical Estimation and Prediction from Additive Group Contributions, Elsevier (2009), pp. 801-802.*

* cited by examiner

ENCAPSULATION COMPOSITION FOR PHOTOVOLTAIC CELL MODULE AND PHOTOVOLTAIC CELL MODULE COMPRISING THE SAME

This application is a Continuation Bypass Application No. PCT/KR2011/009090, filed Nov. 25, 2011, and claims the benefit of Korean Application Nos. 10-2010-20119060 filed on Nov. 26, 2010, 10-2011-0085187, filed Aug. 25, 2011, and 10-2011-0124475, filed Nov. 25, 2011, all of which are hereby incorporated by reference in their entirety for all purposes as if fully set forth herein.

TECHNICAL FIELD

The present application relates to an encapsulation composition, an encapsulant and a photovoltaic cell module including the same.

BACKGROUND ART

Photovoltaic or solar cells are semiconductor devices which can convert light to electricity. When the photovoltaic cells are exposed to light, they usually generate voltage via terminals formed therein to induce subsequent flow of electrons. The flow of electrons has a size proportional to light collision strength for photovoltaic cell junctions formed on the cell surface.

A representative kind of the currently known photovoltaic cells includes a silicon wafer-based photovoltaic cell and a thin film photovoltaic cell. The wafer is a semiconductor material prepared using a single crystal or multi-crystal ingot, and the like. In addition, a photovoltaic device in the thin film type photovoltaic cell is a continuous layer of a semiconductor material deposited on a substrate or a ferroelectric, and the like using a technique such as sputtering or chemical vapor deposition (CVD).

Both wafer-based photovoltaic cells and thin film type photovoltaic cells have brittleness, so that they require a load-tolerant supporting member configured to support the cells. The supporting member can be a top layer (for example, a ferroelectric layer) which is disposed on the upper part of the photovoltaic cells and has light permeability, or a rear layer disposed on the rear side of the photovoltaic cells. A photovoltaic cell module may include a top layer and a rear layer as described above simultaneously, and consist of rigid materials such as a glass plate; flexible materials such as a metal film or a metal sheet; or a suitable plastic material such as polyimide.

Here, the rear layer (for example, a substrate) has usually a rigid back-skin form for protecting the rear side of the photovoltaic cell module. Various materials which may be applied to such a substrate are known, an example of which includes ferroelectrics (for example, glass), organic fluoropolymers (for example, ethylene tetrafluoroethylene (ETFE), Tedlar or polyethyleneterephthalate (PET). Materials as described above may be applied to the module, alone or in a state coated with a silicon-based and/or oxygen-based material (for example, SiOx).

The photovoltaic cell module or solar cell module includes a single photovoltaic cell or an assembly of photovoltaic cells (photovoltaic cell array) electrically interconnected onto the ferroelectric and/or substrate. Such a photovoltaic cell or array is attached to the ferroelectric and/or substrate with an encapsulant to be capsulated. The encapsulant is used to form the integrated module by protecting the cells from external environments, encapsulating the cells and laminating the cells on the ferroelectric or substrate, and the like.

The most widely used encapsulant is an ethylene vinyl acetate (EVA)-based material which is used to attach photovoltaic cells or photovoltaic cell arrays to ferroelectrics and to be subjected to encapsulation. The encapsulant is usually provided in a film, and laminated on cells and ferroelectrics and/or substrates.

The currently known encapsulants for a photovoltaic cell module have the following problems. In encapsulants such as widely used EVA-based materials, adhesivity of glass and modules with the other members is degraded. Therefore, when a photovoltaic cell module is used for a long time, detachment is easily induced at each layer in the module, which causes loss of efficiency or corrosion of the module caused by water permeation. In addition, the currently known encapsulants have lowered resistance against ultraviolet (UV) rays, and the like, and thus, when the module is used for a long time, a problem such as bleaching or discoloration arises to lower efficiency of the module. Furthermore, the current encapsulants such as EVA-based materials cause stress upon hardening, thereby causing damage to the module.

DISCLOSURE

Technical Problem

The present application is intended to provide an encapsulation composition having excellent adhesivity of glass and modules with other members as well as excellent transparency, heat stability, ultraviolet stability and impact resistance, an encapsulant and a photovoltaic cell module.

Technical Solution

One exemplary embodiment of the present application provides an encapsulation composition including an ethylene-alpha olefin copolymer which satisfies the following General Formula 1; and a silane-modified ethylene-alpha olefin copolymer.

$$Re \times Rc \leq 1.0 \qquad \text{[General Formula 1]}$$

wherein Re represents kee/kec, and Rc represents kcc/kce, where kee represents a growth reaction rate constant when ethylene is added to a growing chain in which a terminal activating point is an ethylene monomer, kec represents a growth reaction rate constant when an alpha olefin comonomer is added to a growing chain in which a terminal activating point is an ethylene monomer, kcc represents a growth reaction rate constant when an alpha olefin comonomer is added to a growing chain in which a terminal activating point is an alpha olefin comonomer, and kce represents a growth reaction rate constant when an ethylene monomer is added to a growing chain in which a terminal activating point is an alpha olefin comonomer.

Another exemplary embodiment of the present application provides an encapsulant including an encapsulation composition according to the present application.

Another exemplary embodiment of the present application provides a method of preparing an encapsulant including a step of forming an encapsulation composition in a sheet or film type.

Another exemplary embodiment of the present application provides a photovoltaic cell module having a supporting substrate; a photovoltaic cell or a photovoltaic cell array formed on the supporting substrate; a light receiving substrate formed on the photovoltaic cell or the photovoltaic cell array; and an encapsulating layer including an encapsulation composition according to the present application, wherein the photovoltaic cell or the photovoltaic cell array is encapsulated between the supporting substrate and the light receiving substrate.

Advantageous Effects

According to exemplary embodiments of the present invention, an encapsulation material composition having excellent adhesivity with glass and modules with other members as well as excellent transparency, heat stability, ultraviolet stability and impact resistance can be provided since the encapsulation material composition includes a specific kind of ethylene-alpha olefin copolymer and a silane-modified ethylene-alpha olefin copolymer, thereby improving durability of photovoltaic cell modules.

BEST MODE

Hereinafter, exemplary embodiments of the present application will be described in further detail with reference to the accompanying drawings. Also, detailed descriptions of well-known functions and constructions are omitted for clarity and conciseness. In the drawings, irrelevant descriptions are omitted in order to clearly describe the present application, and the thicknesses of layers and regions may be exaggerated for clarity. The scope of the present application is not limited by thicknesses, sizes, and ratios indicated in the drawings.

The exemplary embodiment of the present application relates to an encapsulation composition including an (a) ethylene-alpha olefin copolymer which satisfies the following General Formula 1; and (b) a silane-modified ethylene-alpha olefin copolymer. The ethylene-alpha olefin copolymer satisfying the following General Formula 1 has a melt flow index (MI) of 0.2 to 50 g/10 min.

$Re \times Rc \leq 1.0$ [General Formula 1]

wherein Re represents kee/kec, and Rc represents kcc/kce, where kee represents a growth reaction rate constant when ethylene is added to a growing chain in which a terminal activating point is an ethylene monomer, kec represents a growth reaction rate constant when an alpha olefin comonomer is added to a growing chain in which a terminal activating point is an ethylene monomer, kcc represents a growth reaction rate constant when an alpha olefin comonomer is added to a growing chain in which a terminal activating point is an alpha olefin comonomer, and kce represents a growth reaction rate constant when an ethylene monomer is added to a growing chain in which a terminal activating point is an alpha olefin comonomer.

The growth reaction rate constants such as kee, kec, kcc and kce may be obtained by measuring an array of monomers using C13 NMR, and the Re and Rc may be calculated using the growth reaction rate constants. The calculated Re and Rc may be applied to General Formula 1 to obtain a value of the product of Re and Rc.

Generally, if $Re \times Rc < 1.0$, the ethylene-alpha olefin copolymer is most likely to be formed into an alternating copolymer; while if $Re \times Rc > 1.0$, the ethylene-alpha olefin copolymer is most likely to be formed into a block copolymer. The term "alternating copolymer" used herein means a form (for example, -A-B-A-B-A-B-A-B-) in which two monomer components (for example, A and B) constituting a copolymer are alternately polymerized, and the term "block copolymer" used herein means a form (for example, -A-A-A-A-B-B-B-B-) in which one monomer component in a copolymer is continuously polymerized to form a block and another monomer component is then polymerized to form a block.

Therefore, the ethylene-alpha olefin copolymer according to an exemplary embodiment of the present application may be a copolymer type that at least three alpha olefin comonomers are continuously not polymerized and have a characteristic of copolymers that alpha olefin comonomers are evenly distributed in a polymer backbone.

In the present application, since the alpha olefin comonomers in the ethylene-alpha olefin copolymer which satisfies General Formula 1 are evenly distributed in the polymer backbone, reaction efficiency may be improved through a homogeneous reaction, when the silane-modified ethylene-alpha olefin copolymer is prepared using the ethylene-alpha olefin copolymer, and thus physical properties of the encapsulant may be improved.

In the present application, the ethylene-alpha olefin copolymer which satisfies General Formula 1 may be prepared using a catalyst composition including a transition metal compound represented by the following Chemical Formula 1, more particularly, a transition metal compound represented by the following Chemical Formula 2 or a transition metal compound represented by the following Chemical Formula 3.

[Chemical Formula 1]

wherein R1 and R2 represent each independently hydrogen; halogen; an alkyl group with 1 to 20 carbon atoms; an alkenyl group with 2 to 20 carbon atoms; an aryl group with 6 to 20 carbon atoms; a silyl group; an alkylaryl group with 7 to 20 carbon atoms; an arylalkyl group with 7 to 20 carbon atoms; or a metalloid group of Group 4 metal substituted with hydrocarbyl, or the R1 and R2 or two R2s may be linked each other with an alkyl group with 1 to 20 carbon atoms or an aryl group with 6 to 20 carbon atoms to form a ring, R3s represent each independently hydrogen; halogen; an alkyl group with 1 to 20 carbon atoms; an alkenyl group with 2 to 20 carbon atoms; an aryl group with 6 to 20 carbon atoms; an alkylaryl group with 7 to 20 carbon atoms; an arylalkyl group with 7 to 20 carbon atoms; an alkoxy group with 1 to 20 carbon atoms; an aryloxy group with 6 to 20 carbon atoms; or an amido group, or at least two R3s in the R3s may be linked each other to form an aliphatic ring or an aromatic ring, CY1 represents a substituted or unsubstituted aliphatic or aromatic ring, where a substituent substituted in the CY1 is halogen; an alkyl group with 1 to 20 carbon atoms; an alkenyl group with 2 to 20 carbon atoms; an aryl group with 6 to 20 carbon atoms; an alkylaryl group with 7 to 20 carbon atoms; an arylalkyl group with 7 to 20 carbon atoms; an alkoxy group with 1 to 20 carbon atoms; an aryloxy group with 6 to 20 carbon atoms; or an amido group, or when the substituent is a plurality of substituents, at least two substituents in the substituents may be linked each other to form an aliphatic or aromatic ring, M represents a Group 4 transition metal; and

Q1 and Q2 represent each independently halogen; an alkyl group with 1 to 20 carbon atoms; an alkenyl group with 2 to 20 carbon atoms; an aryl group with 6 to 20 carbon atoms; an alkylaryl group with 7 to 20 carbon atoms; an arylalkyl group with 7 to 20 carbon atoms; an alkylamido group with 1 to 20 carbon atoms; an arylamido group with 6 to 20 carbon atoms; or an alkylidene with 1 to 20 carbon atoms.

The transition metal compound represented by Chemical Formula 1 may be, for example, compounds for controlling an electronic and stereoscopic environment around the metal, a transition metal compound represented by the following Chemical Formula 2 or 3.

[Chemical Formula 2]

[Chemical Formula 3]

wherein R4 and R5 represent each independently hydrogen; halogen; an alkyl group with 1 to 20 carbon atoms; an aryl group with 6 to 20 carbon atoms; or a silyl group,

R6s represent each independently hydrogen; halogen; an alkyl group with 1 to 20 carbon atoms; an alkenyl group with 2 to 20 carbon atoms; an aryl group with 6 to 20 carbon atoms; an alkylaryl group with 7 to 20 carbon atoms; an arylalkyl group with 7 to 20 carbon atoms; an alkoxy group with 1 to 20 carbon atoms; an aryloxy group with 6 to 20 carbon atoms; or an amido group, or at least two R6s in the R6s may be linked each other to form an aliphatic ring or an aromatic ring,

Q3 and Q4 represent each independently halogen; an alkyl group with 1 to 20 carbon atoms; an alkylamido group with 1 to 20 carbon atoms; or an arylamido group with 6 to 20 carbon atoms, and

M represents a Group 4 transition metal.

The transition metal compound represented by Chemical Formula 1 may be, for example, compounds for controlling an electronic and stereoscopic environment around the metal, transition metal compounds having the following structures.

wherein R7s represent each independently hydrogen or a methyl group, and

Q5 and Q6 represent each independently a methyl group; a dimethylamido group; or a chloride group.

In the present application, a catalyst composition including the transition metal compound represented by Chemical Formula 1 may include one or more selected from the group consisting of a co-catalyst compound represented by the following Chemical Formula 4, a co-catalyst compound represented by the following Chemical Formula 5 and a co-catalyst compound represented by the following Chemical Formula 6.

—[Al(R8)—O]$n$    [Chemical Formula 4]

D(R9)$_3$    [Chemical Formula 5]

[L-H]$^+$[ZA$_4$]$^-$ or [L]$^+$[ZA$_4$]$^-$    [Chemical Formula 6]

wherein R8 and R9 represent each independently halogen; a hydrocarbon with 1 to 20 carbon atoms; or a halogen-substituted hydrocarbon with 1 to 20 carbon atoms, n represents an integer of 2 or more, D represents aluminum or boron, L represents a neutral or cationic Lewis acid, H represents a hydrogen atom, Z represents a Group 13 element, and As represent each independently an aryl group with 6 to 20 carbon atoms in which at least one hydrogen atom is unsubstituted or substituted with halogen, a hydrocarbon with 1 to 20 carbon atoms, alkoxy or phenoxy; or an alkyl group with 1 to 20 carbon atoms.

In the present application, a specific example of the co-catalyst compound represented by Chemical Formula 4 may include methylaluminoxane, ethylaluminoxane, isobutylaluminoxane or butylaluminoxane, and the like, for example, methylaluminoxane.

In the present application, a specific example of the co-catalyst compound represented by Chemical Formula 5 may include trimethylaluminum, triethylaluminum, triisobutylaluminum, tripropylaluminum, tributylaluminum, dimethyl chloro aluminum, triisopropylaluminum, tri-s-butylaluminum, tricyclopentylaluminum, tripentylaluminum, triisopentylaluminum, trihexylaluminum, trioctylaluminum, ethyldimethylaluminum, methyldiethylaluminum, triphenylaluminum, tri-p-tolylaluminum, dimethylaluminummethoxide, dimethylaluminumethoxide, trimethylboron, triethylboron, triisobutylboron, tripropylboron or tributylboron, and the like, be selected from trimethylaluminum, triethylaluminum or triisobutylaluminum.

In the present application, a specific example of the co-catalyst compound represented by Chemical Formula 6 may include triethylammoniumtetraphenylboron, tributylammoniumtetraphenylboron, trimethylammoniumtetraphenylboron, tripropylammoniumtetraphenylboron, trimethylammoniumtetra(p-tolyl)boron, trimethylammoniumtetra(o,p-dimethylphenyl)boron, tributylammoniumtetra(p-trifluoromethylphenyl)boron, trimethylammoniumtetra(p-trifluoromethylphenyl)boron, tributylammoniumtetrapentafluorophenylboron, N,N-diethylaniliniumtetraphenylboron, N,N-diethylaniliniumtetrapentafluorophenylboron, diethylammoniumtetrapentafluorophenylboron, triphenylphosphoniumtetraphenylboron, trimethylphosphoniumtetraphenylboron, triethylammoniumtetraphenylaluminum, tributylammoniumtetraphenylaluminum, trimethylammoniumtetraphenylaluminum, tripropylammoniumtetraphenylaluminum, trimethylammoniumtetra(p-tolyl)aluminum, tripropylammoniumtetra(p-tolyl)aluminum, triethylammoniumtetra(o,p-dimethylphenyl)aluminum, tributylammoniumtetra(p-trifluoromethylphenyl)aluminum, trimethylammoniumtetra(p-trifluoromethylphenyl)aluminum, tributylammoniumtetrapentafluorophenylaluminum, N,N- diethylaniliniumtetraphenylaluminum, N,N-diethylaniliniumtetrapentafluorophenylaluminum, diethylammoniumtetrapentatetraphenylaluminum, triphenylphosphoniumtetraphenylaluminum, trimethylphosphoniumtetraphenylaluminum, tripropylammoniumtetra(p-tolyl)boron, triethylammoniumtetra(o,p-dimethylphenyl)boron, tributylammoniumtetra(p-trifluoromethylphenyl)boron, triphenylcarboniumtetra(p-trifluoromethylphenyl)boron or triphenylcarboniumtetrapentafluorophenylboron, and the like.

In the present application, the compound represented by Chemical Formulas 4 and 5 of the co-catalyst compounds may serve as an alkylating agent and the compound represented by Chemical Formula 6 as an activating agent.

The catalyst composition is in the activated state by a reaction of a transition metal compound represented by Chemical Formula 1 and the aforementioned co-catalyst compound, which is also referred to as a term of the activated catalyst composition. However, since it is not known in this field that the catalyst composition is in the activated state, the term, the activated catalyst composition, should not be separately used.

In the present application, the ethylene-alpha olefin copolymer may be prepared by preparing a catalyst composition using the transition metal compound represented by Chemical Formula 1 and at least one co-catalyst of the co-catalyst compounds represented by Chemical Formulas 4 to 6, and then copolymerizing ethylene monomers and alpha olefin comonomers using the catalyst composition.

In the present application, a method of preparing the catalyst composition is not particularly limited, wherein it may be, for example, prepared by the following method.

First, the catalyst composition may be prepared by a preparation method including steps of mixing the transition metal compound represented by Chemical Formula 1 with the co-catalyst compound represented by Chemical Formula 4 or 5; and mixing the mixture and the co-catalyst compound represented by Chemical Formula 6.

In addition, second, the catalyst composition may be prepared by mixing the transition metal compound represented by Chemical Formula 1 with the co-catalyst compound represented by Chemical Formula 4.

Third, the catalyst composition may be prepared by mixing the transition metal compound represented by Chemical Formula 1 with the co-catalyst compound represented by Chemical Formula 6.

In case of the first preparation method among the methods of preparing a catalyst composition, a molar ratio of the transition metal compound represented by Chemical Formula 1 to the co-catalyst compound represented by Chemical Formula 4 or 5 may be in a range of 1:2 to 1:5,000, for example, 1:10 to 1:1,000, or 1:20 to 1:500. In addition, a molar ratio of the transition metal compound represented by Chemical Formula 1 to the co-catalyst compound represented by Chemical Formula 6 may be in a range of 1:1 to 1:25, for example, 1:1 to 1:10, or 1:2 to 1:5.

In the first preparation method, when the molar ratio of the transition metal compound represented by Chemical Formula 1 to the co-catalyst compound represented by Chemical Formula 4 or 5 is less than 1:2, the content of the alkylating agent is too low to perform a complete alkylation of the transition metal compound. When the ratio is more than 1:5,000, the alkylation of the transition metal compound proceeds, but activation of the alkylated transition metal compound is not completely accomplished due to side reaction of an excess of the remaining alkylating agent and the activating agent represented by Chemical Formula 6.

In addition, when the molar ratio of the transition metal compound represented by Chemical Formula 1 to the co-catalyst compound represented by Chemical Formula 6 is less than 1:1, the content of the activating agent is relatively low and thus, activation of the transition metal compound represented by Chemical Formula 1 is not completely accomplished, so that activity of the resulting catalyst composition is lowered. When the ratio is more than 1:25, activation of the transition metal compound represented by Chemical Formula 1 is completely accomplished, but the unit cost of the catalyst composition is uneconomical or purity of the resulting polymer is lowered due to an excess of the remaining activating agent.

In the case of the second preparation method among the methods of preparing a catalyst composition, the transition metal compound represented by Chemical Formula 1 and the co-catalyst compound represented by Chemical Formula 4 may be present at a molar ratio of 1:10 to 1:10,000, for example, 1:100 to 1:5,000, or 1:500 to 1:2,000.

In the second preparation method, when the molar ratio of the transition metal compound represented by Chemical Formula 1 to the co-catalyst compound represented by Chemical Formula 4 is less than 1:10, the content of the activating agent is relatively low and thus, activation of the transition metal compound represented by Chemical Formula 1 is not completely accomplished. When the ratio is more than 1:10,000, alkylation of the transition metal compound represented by Chemical Formula 1 is completely accomplished, but the unit cost of the catalyst composition is uneconomical or purity of the resulting polymer is lowered due to an excess of the remaining activating agent.

Furthermore, in the case of the third preparation method among the methods of preparing a catalyst composition, the transition metal compound represented by Chemical Formula 1 and the co-catalyst compound represented by Chemical Formula 6 may be present at a molar ratio of 1:1 to 1:25, for example, 1:1 to 1:10, or 1:2 to 1:5.

In the third preparation method, when the molar ratio of the transition metal compound represented by Chemical Formula 1 to the co-catalyst compound represented by Chemical Formula 6 is less than 1:1, the content of the activating agent is relatively low and thus, activation of the transition metal compound represented by Chemical Formula 1 is not completely accomplished, so that activity of the resulting catalyst composition is lowered. When the ratio is more than 1:25, activation of the transition metal compound represented by Chemical Formula 1 is completely accomplished, but the unit cost of the catalyst composition is uneconomical or purity of the resulting polymer is lowered due to an excess of the remaining activating agent.

In addition, the transition metal compound represented by Chemical Formula 1 and the co-catalyst compound represented by Chemical Formulas 4 to 6 may be also used in a form supported on silica or alumina.

In the method of polymerizing ethylene-alpha olefin copolymers, the aforementioned catalyst composition may be used by dissolving it in or diluting it with an aliphatic hydrocarbon solvent with 5 to 12 carbon atoms such as pentane, hexane, heptane, nonane, decane and isomers thereof; an aromatic hydrocarbon solvent such as toluene and benzene; a hydrocarbon solvent substituted with a chlorine atom such as dichloromethane and chlorobenzene, and the like. The solvent for the catalyst composition used as described above is treated with a small quantity of alkyl aluminum to remove a small quantity of water or air serving as a catalyst poison, and is also possible to be practiced using further a co-catalyst.

In the present application, an alpha olefin comonomer to be copolymerized with an ethylene monomer using the aforementioned catalyst composition is not particularly limited to any kind, which may also include a diene olefin monomer having two double bonds or a triene olefin monomer having three double bonds as well as an olefin monomer having one double bond.

In an exemplary embodiment of the present application, the alpha olefin comonomer according to the present application may be an alpha olefin with 3 to 20 carbon atoms. An example of the alpha olefin comonomer may include propylene, 1-butene, 1-pentene, 4-methyl-1-peneten, 1-hexene, 1-heptene, 1-octene, 1-decene, 1-undecene, 1-dodecene, 1-tetradecene, 1-hexadecene, 1-eicosene, norbornene, norbornadiene, ethylidenenorbornene, phenylnorbornene, vinylnorbornene, dicyclopentadiene, 1,4-butadiene, 1,5-pentadiene, 1,6-hexadiene, styrene, alph-methylstyrene, divinylbenzene or 3-chloromethylstyrene, and the like, at least two of which can be also used in combination therewith. In an another exemplary embodiment of the present application, it may be at least one selected from the group consisting of propylene, 1-butene, 1-pentene, 4-methyl-1-peneten, 1-hexene, 1-heptene, 1-octene, 1-decene, 1-undecene, 1-dodecene, 1-tetradecene, 1-hexadecene and 1-eicosene, or at least one selected from the group consisting of propylene, 1-butene, 1-hexene, 4-methyl-1-pentene and 1-octene, or 1-octene. A polymerization solvent for dissolving the monomer is not particularly limited to any kind, but, for example, it may be use n-hexane.

In the present application, a method of polymerizing the ethylene-alpha olefin copolymer is not particularly limited, for example, a liquid process using the catalyst composition. Also, when the catalyst composition is used by supporting it on an inorganic carrier such as silica or alumina, ethylene-alpha olefin copolymer may be polymerized by a slurry or gas phase process.

In the present application, a reactor used in the process of preparing the ethylene-alpha olefin copolymer is not particularly limited to any kind, which may be, for example, a continuous stirred tank reactor (CSTR) or a continuous flow reactor (PFR). Furthermore, in the process of polymerizing the ethylene-alpha olefin copolymer, at least two of the reactors may be align in series or parallel. In addition, in the process for preparing the ethylene-alpha olefin copolymer, a separator for separating the solvent and the unreacted monomer from the reacting mixture may be further included.

In the ethylene-alpha olefin copolymer of the present application, the molar ratio of the ethylene monomer and the alpha olefin comonomer may be in a range of 100:1 to 1:100, for example, 10:1 to 1:10, or 2:1 to 1:5. When the molar ratio of the ethylene monomer to the alpha olefin comonomer is in excess of 100:1 (for example, 110:1), density of the resulting copolymer increases, so that it may be difficult to prepare a low density copolymer. When the molar ratio is in excess of 1:100 (for example, 1:110), the content of the unreacted comonomer increases, the conversion ratio is lowered and thus, a problem that the amount of recycle increases under process may be caused.

In the present application, the molar ratio of the monomer and the polymerization solvent suitable for the polymerization should be a ratio suitable to dissolve raw materials before reaction and the resulting polymer after reaction. Specifically, the molar ratio of the monomer and the polymerization solvent may be 10:1 to 1:10,000, for example, 5:1 to 1:100 or 1:1 to 1:20. In the present application, when the molar ratio of the monomer and polymerization solvent is in excess of 10:1 (for example, 15:1), the content of solvent is so low that viscosity of the fluid may increase and thus a problem to transfer the resulting copolymer be caused. When the ratio is in excess of 1:10,000 (for example, 1:11,000), the content of solvent is more than necessary, so that a problem such as equipment increase and energy cost increase according to recycle for purifying the polymerization solvent may be caused.

The density of an ethylene-alpha olefin copolymer prepared as described above may be in a range of 0.85 to 0.91 g/cm$^3$. When the density of the ethylene-alpha olefin copolymer is less than 0.85 g/cm$^3$, crystalline areas are reduced, heat resistance is reduced and thus, processability may be deteriorated. When it is in excess of 0.91 g/cm$^3$, the crystalline areas are too large and thus, transparency may be reduced.

A melt flow index (MI) of the ethylene-alpha olefin copolymer satisfying General Formula 1 may be 0.2 g/10 min to 50 g/10 min, for example, 1 g/10 min to 30 g/10 min, 1 g/10 min to 15 g/10 min, 1 g/10 min to 10 g/10 min, 1 g/10 min to 5 g/10 min, 3 g/10 min to 6 g/10 min, 5 g/10 min to 15 g/10 min, or 15 g/10 min to 30 g/10 min. It is apparent to those skilled in the related art that one exemplary embodiment of the MI value may be any value in a range of 0.2 g/10 min to 50 g/10 min. When the melt flow index (MI) of the ethylene-alpha olefin copolymer is less than 0.2 g/10 min, it may be difficult to process the encapsulant due to an increase in molecular weight and viscosity. On the other hand, when the melt flow index (MI) of the ethylene-alpha olefin copolymer is in excess of 50 g/10 min, physical properties may be lowered due to a decrease in molecular weight. By way of example, the melt flow index (MI) of the ethylene-alpha olefin copolymer may be measured under the conditions such as a temperature of 190° C. and a load of 2.16 kg in accordance with the ASTM D1238 standard, but the present application is not limited thereto.

According to exemplary embodiments of the present application, to control physical properties of the ethylene-alpha olefin copolymer provided in the encapsulation composition, an encapsulation composition having excellent processability and simultaneously exhibiting excellent physical properties as an encapsulant may be provided, in addition to the aforementioned requirements satisfying General Formula 1, by specifically defining a melt flow index of the ethylene-alpha olefin copolymer. The melt flow index of the ethylene-alpha olefin copolymer is determined according to a temperature upon polymerization of a copolymer, a molecular weight of the copolymer, and a content of a comonomer. For example, when a polymerization temperature used for polymerization of the ethylene monomer and the alpha olefin comonomer is low, a copolymer having a low melt flow index is prepared, whereas a copolymer having a high melt flow index is prepared when the polymerization temperature is high. A molecular weight of the copolymer is altered according to the polymerization temperature, the copolymer polymerized at a low temperature increases in molecular weight, which leads to an increase in viscosity and a decrease in melt flow index. In the case of the copolymer having such a low melt flow index, processability of the copolymer may be degraded due to an increase in molecular weight and viscosity in a step of processing the copolymer into an encapsulant as will be described later. On the other hand, the copolymer polymerized at a high temperature has a low molecular weight, which leads to a decrease in viscosity and an increase in melt flow index. In the case of the copolymer having such a high melt flow index, durability-related physical properties of a product processed from such a copolymer, such as impact strength, peeling strength, and heat stability, may be degraded The polymerization temperature of the ethylene-alpha olefin copolymer may be in a range of 140 to 155° C. Also, the molecular weight of the ethylene-alpha olefin copolymer may be in a range of 40,000 to 180,000, but the present application is not limited thereto.

In the present application, a polydispersity index (Mw/Mn) of the ethylene-alpha olefin copolymer may be in a range of 1.5 to 3.5, or 2.0 to 3.0. When the polydispersity index of the ethylene-alpha olefin copolymer is less than 1.5, a load may increase upon extrusion. When it is in excess of 3.5, physical properties such as transparency and adhesivity, and the like may be reduced.

In the present application, the silane-modified ethylene-alpha olefin copolymer may be in the form of a copolymer in which silane monomers are included in the ethylene-alpha olefin copolymer in a copolymerized form, or a graft copolymer in which silane monomers are engrafted into the ethylene-alpha olefin copolymer. In this case, the ethylene-alpha olefin copolymer used for preparation of the silane-modified ethylene-alpha olefin copolymer may be an ethylene-alpha olefin copolymer satisfying General Formula 1. When such an ethylene-alpha olefin copolymer is used, reaction efficiency may be improved through a uniform reaction upon preparation of the silane-modified ethylene-alpha olefin copolymer as described above, thereby improving physical properties (for example, adhesive strength, etc.) of an encapsulant.

In the present application, the silane monomer included in the silane-modified ethylene-alpha olefin copolymer in a copolymerized form or a grafted form may be unsaturated silane including an ethylenic unsaturated hydrocarbon group or a hydrolyzable functional group. For example, the silane monomer used herein may have a functional group, such as vinyl, acryl, amino, chloro and phenoxy. More specifically, ethylenic unsaturated silane such as vinyl trimethoxy silane, vinyl triethoxy silane, vinyl triacetoxy silane or γ-ketacrylaoxypropyltrimethoxysilane, is used, but the present application is not limited thereto.

In exemplary embodiments of the present application, vinyl trimethoxysilane having a vinyl functional group which is easiest polymerizable may be used together with a radical initiator, as a silane monomer applied to an ethylene-alpha olefin copolymer, to prepare the silane-modified ethylene-alpha olefin copolymer.

In the present application, the silane monomer included in the silane-modified ethylene-alpha olefin copolymer in a polymerized form may be included at a content of 0.1 to 5 parts by weight, for example, 0.5 to 4.5 parts by weight, 1 to 5 parts by weight, 3 to 5 parts by weight, 4 to 5 parts by weight, or 4 to 4.5 parts by weight, based on 100 parts by weight of the silane-modified ethylene-alpha olefin copolymer. When the content of the silane compound is less than 0.1 parts by weight, adhesive characteristics of the prepared encapsulation composition may be degraded. On the other hand, when the content of the silane compound is in excess of 5 parts by weight, the more radical initiator should be used in consideration of the reaction efficiency, and thus it is difficult to control physical properties of the encapsulation composition, and the physical properties of the encapsulation composition may be degraded.

In the present application, the radical initiator that may be used herein may include benzoyl peroxide, di-tert-butyl peroxide, azobisisobutyronitrile, tert-butyl hydroperoxide, dicumyl peroxide, t-butyl perbenzoate, cumen hydroperoxide, t-butyl peroctoate, methyl ethyl ketone peroxide, 2,5-dimethyl-2,5-di(t-butylperoxy)hexane, lauryl peroxide, t-butyl peracetate, liquid peroxide (Lupersol 101 manufactured by Pennwalt), or Percadox-14 (manufactured by Akzo Nobel), and the like, t-butyl peracetate, and liquid peroxide (Lupersol 101 manufactured by Pennwalt) being used, but the present application is not limited thereto.

In the present application, the radical initiator may be contained in a range of 0.001 to 5 parts by weight, or 0.01 to 3 parts by weight, based on 100 parts by weight of the silane monomer included in the silane-modified ethylene-alpha olefin copolymer in a polymerized form. When the content of the radical initiator is less than 0.001 parts by weight, production of reactive radicals may be reduced, reaction efficiency may be lowered. When it is in excess of 5 parts by weight, production of reactive radicals increases to form a side reaction, and thus physical properties of the encapsulation composition maybe be lowered.

In the present invention, the silane-modified ethylene-alpha olefin copolymer may be included at a content of 10 to 900 parts by weight, or 20 to 500 parts by weight, based on 100 parts by weight of the ethylene-alpha olefin copolymer. When the content of the silane-modified ethylene-alpha olefin copolymer is less than 10 parts by weight, a decrease in peeling strength may be caused due to a decrease in adhesivity. On the other hand, when the content of the silane-modified ethylene-alpha olefin copolymer is in excess of 900 parts by weight, peeling strength may be reduced due to deteriorated physical properties of the polymer.

In the present application, to prepare the silane-modified ethylene-alpha olefin copolymer, at least one additive selected from the group consisting of antioxidant, ultraviolet stabilizer, filler and colorant may be added in addition to the radical initiator. A polymerization between the silane monomer and the ethylene-alpha olefin copolymer may be practiced under a nitrogen atmosphere at 50 to 230° C.

In the present application, the encapsulation composition may further include another ethylene-alpha olefin copolymer having a molecular weight, density, or the like different from the ethylene-alpha olefin copolymer (a) satisfying General Formula 1. Hereinafter, the ethylene-alpha olefin copolymer further included in the encapsulation composition is referred to as a second ethylene-alpha olefin copolymer.

Like the ethylene-alpha olefin copolymer (a), the second ethylene-alpha olefin copolymer further included as described above satisfies General Formula 1. Here, the second ethylene-alpha olefin copolymer having a melt flow index (MI) of 0.2 g/10 min to 50 g/10 min may have good miscibility.

In the present application, the further included second ethylene-alpha olefin copolymer may be included at a content of 10 to 1,000 parts by weight, and in some exemplary embodiments, at a content of 50 to 500 parts by weight, based on 100 parts by weight of the encapsulation composition including the ethylene-alpha olefin copolymer satisfying Chemical Formula 1 and the silane-modified ethylene-alpha olefin copolymer. The encapsulation composition includes two ethylene-alpha olefin copolymers, and thus physical properties such as impact strength may be improved. When the content of the further included second ethylene-alpha olefin copolymer is less than 10 parts by weight, processability and physical properties may be degraded. When the content of the further included second ethylene-alpha olefin copolymer is in excess of 1,000 parts by weight, adhesivity may be degraded.

The present encapsulation composition may further include at least one additive selected from the group consisting of ultraviolet absorbers, light stabilizers, antioxidants, glass fibers and glass bubbles.

The ultraviolet absorber which can be used herein may include benzophenone compounds such as 2-hydroxy-4-methoxybenzophenone, 2,2-dihydroxy-4-methoxybenzophenone, 2-hydroxy-4-methoxy-4-carboxybenzophenone or 2-hydroxy-4-N-octoxybenzophenone; benzotriazole compounds such as 2-(2-hydroxy-3,5-di-t-butylphenyl)benzotriazole or 2-(2-hydroxy-5-methylphenyl)benzotriazole; salicylic acid ester compounds such as phenyl salicylate or p-octylphenyl salicylate, but the present application is not limited thereto. In the present application, the content of the ultraviolet absorber may be 0.05 to 1.0 parts by weight, or 0.1 to 0.8 parts by weight, based on 100 parts by weight of the encapsulation composition.

The light stabilizer which can be used herein may include hindered amine compounds or piperidine compounds, and the like, but the present application is not limited thereto. In the present application, the content of the light stabilizer may be 0.05 to 1.0 parts by weight, or 0.1 to 0.8 parts by weight, based on 100 parts by weight of the encapsulation composition.

The antioxidant which can be used herein may include phenol compounds or phosphate compounds, and the like, but the present application is not limited thereto. In the present application, the content of the antioxidant may be 0.1 to 0.5 parts by weight, or 0.2 to 0.4 parts by weight, based on 100 parts by weight of the encapsulation composition.

The glass fibers or glass bubbles which can be used herein are not particularly limited to any kind, and those generally known in this field may be used without limitation.

The present application also relates to an encapsulant including the encapsulation composition according to the present application.

A form of the present encapsulant is not particularly limited, but for example, may be a sheet or film shape.

When the shape of the present encapsulant is a sheet or film shape, a thickness of the sheet or film is 0.2 to 0.8 mm, but the present application is not limited thereto. When the thickness of the encapsulant sheet or encapsulant film is less than 0.2 mm, a capability of absorbing outside impacts may be lowered. When it is in excess of 0.8 mm, capability of absorbing impacts is improved, but processability and light permeability may be lowered due to excessive increase of thickness.

The present application also relates to a method of preparing an encapsulant including a step of forming an encapsulation composition according to the present application into a sheet or film form.

The step of forming the present encapsulation composition including the ethylene-alpha olefin copolymer and the silane-modified ethylene-alpha olefin copolymer as prepared by the aforementioned method into a sheet or film may be carried out via T-die extrusion method or Calendering method, but the present application is not limited thereto.

For example, the ethylene-alpha olefin copolymer; the silane-modified ethylene-alpha olefin copolymer; and an additive such as ultraviolet absorber or light stabilizer may be continuously introduced into an extruder at the same time to prepare an encapsulant having a sheet or film shape.

Also, the present application is directed to providing a photovoltaic cell module. The photovoltaic cell module according to one exemplary embodiment the present application includes a supporting substrate, a photovoltaic cell or a photovoltaic cell array formed on the supporting substrate, a light receiving substrate formed on the photovoltaic cell or photovoltaic cell array, and an encapsulating layer configured to encapsulate the photovoltaic cell or photovoltaic cell array between the supporting substrate and the light receiving substrate and including the encapsulation composition according to the present application.

In the present application, the supporting substrate serves to protect the back side of the photovoltaic cell module from the external environment and requires weather resistance. In the present application, the supporting substrate is not particularly limited to any kind, and may include, for example, a metal plate or foil such as aluminum, a fluorine resin sheet, a cyclic polyolefin resin sheet, a polycarbonate resin sheet, a poly(meth)acrylic resin sheet, a polyamide resin sheet, a polyester resin sheet or a composite sheet that a weather-resistant film and a barrier film are laminated, and the like.

A thickness of the supporting substrate used herein is not particularly limited, and may be, for example 30 to 2,000 µm, 50 to 1,000 µm, or 100 to 600 µm. In the present application, by controlling the thickness of the supporting substrate in a range of 30 to 2,000 µm, the photovoltaic cell module may have excellent physical properties, such as weather resistance, while the photovoltaic cell module is formed thinner.

In the present application, the photovoltaic cell formed on the supporting substrate is not particularly limited to any specific kind, as long as it can generate photovoltaic power, and a photovoltaic cell device which is generally available in this field may be used. For example, crystalline silicon photovoltaic cell such as monocrystalline silicon and multicrystalline silicon, amorphous silicon photovoltaic cell such as single coupling or tandem constructing, Group III-V compound semiconductor photovoltaic cell such as gallium-arsenic (GaAs) and indium-phosphorus (InP) and Group II-VI compound semiconductor photovoltaic cell such as cadimium-tellurium (CdTe), copper-indium-selenide ($CuInSe_2$) may be used, and thin film multicrystalline silicon photovoltaic cell, thin film microcrystalline silicon photovoltaic cell and mixed photovoltaic cell of thin film crystalline silicon and amorphous silicon may be also used.

In the present application, the photovoltaic cell may form a photovoltaic cell array (photovoltaic composite) with wiring linking a photovoltaic cell and a photovoltaic cell. When the present photovoltaic cell module is illuminated by light of the sun, electrons (−) and holes (+) are generated inside of the photovoltaic cell and electric currents are flowed via wiring linking the photovoltaic cell and the photovoltaic cell.

In the present application, the light receiving substrate formed on the photovoltaic cell or photovoltaic cell array may perform functions to protect inside of the photovoltaic cell module from weather, outer impacts or fire, and the like and to secure a long-term reliability on outdoor exposure of the photovoltaic cell module. The light receiving substrate of the present application is not particularly limited to any specific kind, as long as it has excellent light permeability, electric insulation, and mechanical or physicochemical strength, and for example, a glass plate, a fluorine resin sheet, a cyclic polyolefin resin sheet, a polycarbonate resin sheet, a poly(meth)acrylic resin sheet, a polyamide resin sheet or a polyester resin sheet, and the like, may be used. In an exemplary embodiment of the present, a glass plate having excellent heat resistance may be used, but the present application is not limited thereto.

A thickness of the light receiving substrate used herein is not particularly limited, and may be, for example, 0.5 to 10 mm, 1 to 8 mm, or 2 to 5 mm. By controlling the thickness of the light receiving substrate in a range of 0.5 to 10 mm, the photovoltaic cell module may have excellent physical properties such as a long-term reliability, while the photovoltaic cell module is formed thinner.

In addition, the encapsulating layer configured to encapsulate the photovoltaic cell or the photovoltaic cell array inside of the photovoltaic cell module, especially between the supporting substrate and light receiving substrate may include the aforementioned encapsulation composition according to the present application.

The encapsulating layer may include an encapsulation composition according to the present application as described above and have excellent adhesivity of the supporting substrate and the light receiving substrate as well as excellent transparency, heat stability, ultraviolet stability and impact resistance to extend a life span of the photovoltaic module.

In the present application, the encapsulating layer may have a single layer form, and also a multi-layer form including a first layer encapsulating the photovoltaic cell or the photovoltaic cell array in contact with the light receiving substrate and a second layer encapsulating the photovoltaic cell or the photovoltaic cell array in contact with the supporting substrate.

In the present application, the encapsulating layer may have a light transmission of 92% or more, 94% or more, or 96% or more. In the present application, when the light transmission of the encapsulating layer is controlled to 92% or more, light conversion efficiency of the photovoltaic cell may be improved by providing the photovoltaic cell module with transparency.

In the present application, the upper limit of light transmission in the encapsulating layer is not particularly limited, and it may be more preferred to be closer to 100%. The reason is because the closer to 100% the light transmission, the photovoltaic cell has higher chance to be in contact with light, and thus may improve the light conversion efficiency.

In the present application, a haze of the encapsulating layer may be 14% or less, 12% or less, or 11% or less. In the present application, by controlling the haze of the encapsulating layer to 14% or less, it may provide the photovoltaic cell module with transparency to improve light conversion efficiency of the photovoltaic cell.

In the present application, the lower limit of haze in the encapsulating layer is not particularly limited, and it may be more preferred to be closer to 0%. The reason is because the closer to 0% the haze, the photovoltaic cell has more light energy to be in contact therewith, and thus may improve the light conversion efficiency.

In the present application, a method of measuring light transmission and haze in the encapsulating layer is not particularly limited, which may be performed with means which is generally available in this field. For example, light transmission and haze have been measured using a reflectance-transmittance meter (HR-100 manufactured by Murakami Company), but the present application is not limited thereto.

In the present application, a peeling strength of the encapsulating layer may be 60 N/15 mm or more.

In the present application, the peeling strength of the encapsulating layer represents a peeling strength measured with a tensile tester at a peeling rate of 50 mm/min and a peeling angle of 90° under an atmosphere at 25° C. after attaching the encapsulant to a substrate.

A specimen composed of a substrate and an encapsulant prepared by an encapsulation composition may have a peeling strength of 60 N/15 mm or more, 70 N/15 mm or more, or 80 N/15 mm or more, as measured according to a specific standard, specifically the ASTM D903 standard.

The upper limit of the peeling strength is not particularly limited, and may be controlled in a range of, for example, 300 N/15 mm or less, 250 N/15 mm, or 200 N/15 mm or less.

In the present application, a method of measuring a peeling strength of the encapsulating layer is not particularly limited, and the peeling strength may be measured by, for example, the following method. First, an encapsulant having a thickness of 500 μm is prepared from the encapsulation composition of the present application in accordance with the aforementioned process and tailored in a size of 5 cm×5 cm (width×length). Then, after one side of the encapsulant is attached to a plate glass (thickness: 3 mm) as a light receiving substrate and the other side of the encapsulant to a supporting substrate, the resulting matter is pressed in a vacuum laminator for preparing a photovoltaic cell module at a temperature of 150° C. for 15 minutes to prepare a sample, a peeling strength of which may be measured in a standard (ASTM D903 standard) of a temperature of 25° C., a peeling rate of 50 mm/min and a peeling angle of 90° after 20 minutes. The supporting substrate is a laminate sheet that a polyvinyl fluoride resin sheet having a thickness of 38 μm, an aluminum foil having a thickness of 30 μm and a polyvinyl fluoride resin sheet having a thickness of 38 μm are sequentially laminated.

The present application controls the peeling strength to 60 N/15 mm or more to have excellent adhesivity of the glass substrate or the photovoltaic cell module with other components, whereby may prevent causing peeling-off at each layer of the photovoltaic cell module and thus prevent the efficiency of the photovoltaic module from deteriorating, or causing corrosion by water permeation.

In the present application, a drop impact strength of the encapsulating layer may also be 1,400 g or more.

In the present application, the drop impact strength of the encapsulating layer represents the drop impact strength measured by a drop impact tester after a weight with a diameter of 38 mm is subjected to free fall at a height of 0.66 m on the encapsulant film having a thickness of 100 μm.

The encapsulant film prepared from the present encapsulation composition may have the drop impact strength (X2), as measured according to a specific standard, specifically the ASTM D1709A standard, of 1,400 g or more, 1,800 g or more, or 2,000 g or more.

In the present application, the upper limit of the drop impact strength is not particularly limited, which may be controlled in a range of for example, 4,000 g or less, 3,000 g or less, or 2,500 g or less.

In the present application, a method of measuring the drop impact strength of the encapsulating layer is not particularly limited, and the drop impact strength may be, for example, measured by the following method. First, an encapsulant film having a thickness of 100 μm is prepared from the present encapsulation composition and tailored in a size of 5 cm×5 cm (width×length) to prepare a specimen. Then, the specimen is positioned on a drop impact tester, according to the ASTM D1709A standard, and a weight with a diameter of 38 mm is subjected to free fall at a height of 0.66 m to measure the drop impact strength.

The present application controls the drop impact strength of the encapsulating layer to 1,400 g or more, whereby it may protect the photovoltaic cell or the photovoltaic cell array from outer impacts and thus prevent from damage of the photovoltaic cell module.

The present photovoltaic cell module to which the characteristic encapsulant as described above is applied includes wafer-based modules or thin film modules, which may be also various photovoltaic modules known in this field.

In addition, the present photovoltaic cell module may be formed into various forms without particular limitation, as long as it includes the characteristic encapsulant as mentioned above. The attached FIGS. 1 and 2 are drawings representing cross sectional views of photovoltaic cell modules according to various aspects of the present application.

Figure 1:
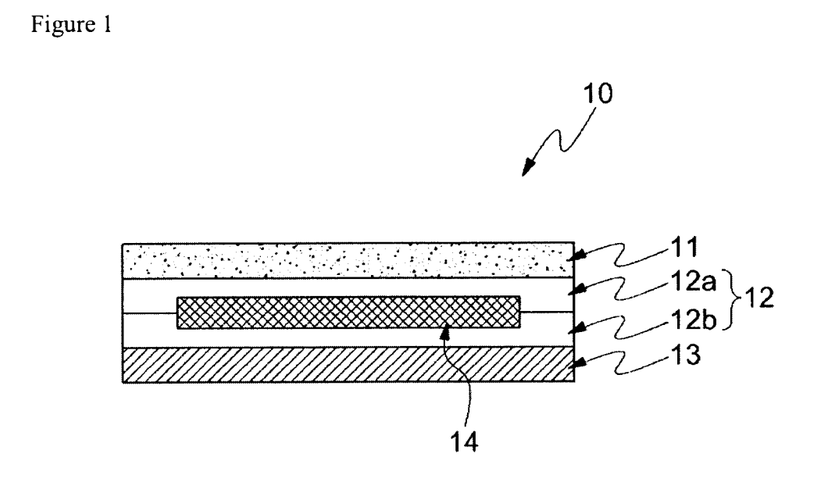
FIG. 1 is a drawing representing a sectional view of a photovoltaic cell module according to one aspect of the present application.

The attached FIG. 1 is a drawing representing one exemplary embodiment of a wafer-based photovoltaic cell module 10 including the present encapsulant. As shown in the attached FIG. 1, the photovoltaic cell module according to one aspect of the present application may include a light receiving substrate 11 which can be usually composed of ferroelectrics (for example, glass); a supporting substrate 13 which can be composed of Tedlar or PET/SiOx-PET/Al-based raw materials; a photovoltaic cell device 14 such as the silicon-based wafer; and an encapsulating layer 12 configured to encapsulate the photovoltaic cell device 14. At this time, the encapsulating layer 12 may include a first layer 12a attached to the light receiving substrate 11, with encapsulating the photovoltaic cell device 14, and a second layer 12b attached to the supporting substrate 13, with encapsulating the photovoltaic cell device 14. In the present application, the first layer and the second layer formed into the encapsulating layer 12 may contain the characteristic ingredients as mentioned above.

Figure 2:
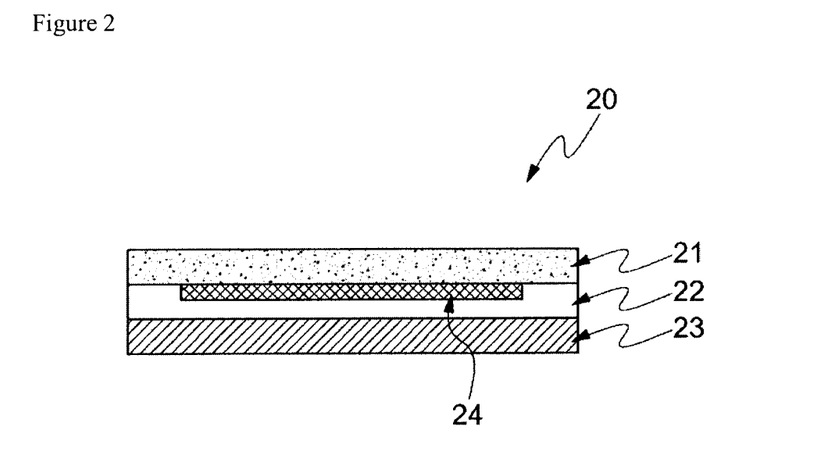
FIG. 2 is a drawing representing a sectional view of a photovoltaic cell module according to the other aspect of the present application.

The attached FIG. 2 is a drawing representing a cross sectional view of a thin film photovoltaic cell module 20 according to other aspect of the present application. As shown in the attached FIG. 2, in case of the thin film photovoltaic cell module 20, the photovoltaic cell device 24 may be formed on the light receiving substrate 21 which can be usually composed of ferroelectrics. Such a thin film photovoltaic cell device 24 may be usually deposited by a method such as chemical vapor deposition (CVD). The photovoltaic cell module 20 of the attached FIG. 2 includes, similar to the photovoltaic cell module 10 of FIG. 1, an encapsulating layer 22 and a supporting substrate 23, and the encapsulating layer 22 may be formed by a single layer. The detailed description of the encapsulating layer 22 and supporting substrate 23 is as mentioned above.

A method of preparing the photovoltaic cell module as described above is not particularly limited, which may be selected from various methods known to one skilled in this field without limitation to prepare the module.

In the present application, the aforementioned components forming the encapsulant are each suitably formulated to prepare a composition, which is prepared into a hot melt sheet or a liquid phase form, and then the photovoltaic cell module may be prepared using the same.

The term, 'hot melt sheet,' used in the specification means a sheet-like shaped product prepared from the encapsulation composition including the aforementioned ethylene-alpha olefin copolymer and silane-modified ethylene-alpha olefin copolymer. The hot melt sheet may be a raw material which can be present in an uncured or partially-cured state prior to application, have the increased strength and flow resistance at room temperature, be converted into a flowable material having low viscosity with heating and again into high viscous material with cooling. In this field, a method for preparing the hot melt sheet using each aforementioned raw material is known.

In case of using the hot melt sheet according to the present application, after laminating the light receiving substrate, the photovoltaic cell device, the supporting substrate and the hot melt sheet depending on the desired module structure, the aforementioned photovoltaic cell module may be prepared via hot press means with vacuum suction.

In addition, the present application may prepare the aforementioned photovoltaic cell module by preparing the encapsulation composition according to the present application into a liquid phase form and forming and curing the encapsulant around the photovoltaic cell device with a coating method using the same. Without particular limitation, it is preferred in view of production unit cost reduction and process efficiency to form the encapsulant with a direct coating method using a liquid composition as described above.

EXAMPLES

Hereinafter, the present application is explained in more detail via Examples according to the present application and Comparative Examples which do not according to the present application, but the scope of the present application is not limited to Examples as described below.

Preparative Example 1

Preparation of Ethylene-Alpha Olefin Copolymer 3.20 kg/h of a hexane solvent, 0.55 kg/h of a 1-octene comonomer and 0.63 kg/h of an ethylene monomer were fed at contents listed in the following Table 1 and a pressure of 89 bars into a 1.5 L continuously stirred reactor pre-heated at a temperature of 150° C. Then, 0.40 μM/min of [(7-methyl-1,2,3,4-tetrahydroquinolin-8-yl)tricyclopentadienyl-η5,κ-N] titanium methyl and 0.60 μM/min of an octadecylmethylammonium tetrakis(pentafluorophenyl)borate co-catalyst were fed from a catalyst storage tank to the reactor to perform a copolymerization reaction. The copolymerization reaction was performed at a temperature of 140 to 180° C. The polymer solution formed by the copolymerization reaction was decompressed to 7 bars at a rear stage of the reactor, and then transferred into a solvent separator pre-heated at 230° C. to remove most of the solvent by a solvent separation process. The remaining solvent in the copolymer transferred into a second solvent separator using a pump was completely removed using a vacuum pump, and the copolymer was then passed through cooling water and a cutter to obtain the granulated polymer.

Preparative Examples 2 to 3

Preparation of Ethylene-Alpha Olefin Copolymers

Ethylene-alpha olefin copolymers were prepared in the same manner as in Preparative Example 1, except that contents of the hexane solvent, the 1-octene monomer and the ethylene monomer were changed as listed in the following Table 1.

Preparative Example 4

Preparation of Ethylene-Alpha Olefin Copolymer

An ethylene-alpha olefin copolymer was prepared in the same manner as in Preparative Example 1, except that the 1.5 L continuously stirred reactor pre-heated at a temperature of 154° C. was used.

TABLE 1

|  | Polymerization solvent | Ethylene monomer | Alpha olefin monomer |
|---|---|---|---|
| Preparative Example 1 | 3.20 kg/h | 0.63 kg/h | 0.55 kg/h |
| Preparative Example 2 | 3.20 kg/h | 0.63 kg/h | 0.55 kg/h |
| Preparative Example 3 | 3.20 kg/h | 0.63 kg/h | 0.55 kg/h |
| Preparative Example 4 | 3.20 kg/h | 0.63 kg/h | 0.55 kg/h |

Polymerization solvent: hexane
Alpha olefin monomer: 1-octene

Comparative Preparative Example 1

Ethylene-Alpha Olefin Copolymer

No separate ethylene-alpha olefin copolymer was polymerized, and ENGAGE 8452 of Dow Chemicals was used as the ethylene/1-octene copolymer.

Comparative Preparative Example 2

Preparation of Ethylene-Alpha Olefin Copolymer

An ethylene-alpha olefin copolymer was prepared in the same manner as in Preparative Example 1, except that the 1.5 L continuously stirred reactor pre-heated at a temperature of 135° C. was used.

Comparative Preparative Example 3

Preparation of Ethylene-Alpha Olefin Copolymer

An ethylene-alpha olefin copolymer was prepared in the same manner as in Preparative Example 1, except that the 1.5 L continuously stirred reactor pre-heated at a temperature of 160° C. was used.

The ethylene-alpha olefin copolymers prepared in Preparative Examples 1 to 4 and Comparative Preparative Examples 1 to 3 were measured for physical properties using the following methods.

(1) Measurement of Density

Density was measured using an ASTM D792 assay.

(2) Measurement of Melt Flow Index (MI)

Melt flow index was measured under the conditions such as a temperature of 190° C. and a load of 2.16 kg using an ASTM D1238 assay.

(3) Measurement of Polydispersity Index (PDI)

Each of weight average molecular weights (Mw) and number average molecular weights of the ethylene-alpha olefin copolymers prepared in Preparative Examples 1 to 4 and Comparative Preparative Examples 1 to 3 was measured using a molecular weight measuring apparatus, PL-GPC 220, and polydispersity indexes were calculated by applying the measured values into the following General Formula 4.

$$PDI = Mw/Mn \quad \text{[General Formula 4]}$$

(4) Measurement of Monomer Reactivity Ratio

The ethylene-alpha olefin copolymers prepared in Preparative Examples 1 to 4 and Comparative Preparative Examples 1 to 3 were dissolved in a solvent (1,1,2,2-tetrachloroethane-d2 (TCF-d2):trichlorobenzene (TCB)=2:1 (by volume)), and approximately 0.4 ml of each of the resulting solutions was poured into a tube with a diameter of 5 mm and a length 18 cm. Thereafter, the tubes were disposed in a 13C NMR spectroscope, and kee, kec, kcc and kce values were measured in a condition in which a frequency, a temperature, a decay time (D1) and a scan of the 13C NMR spectroscope were set to 150 MHz, 100° C., 0.5 seconds to 1 second, and 50 k, respectively. Then, the measured values were applied to the following General Formulas 5 and 6 to calculate the monomer reactivity ratios.

$$Re \text{ (reactivity ratio of ethylene monomer)} = kee/kec \quad \text{[General Formula 5]}$$

$$Rc \text{ (reactivity ratio of alpha olefin comonomer)} = kcc/kce \quad \text{[General Formula 6]}$$

The results obtained by measuring physical properties as described above are summarized and listed in the following Table 2.

TABLE 2

| | Basic physical properties | | | Monomer reactivity ratio | | |
|---|---|---|---|---|---|---|
| | Density ($g/cm^3$) | MI (g/10 min) | PDI | Re | Rc | Re × Rc |
| Preparative Example 1 | 0.875 | 5.1 | 2.35 | 1.34 | 0.74 | 0.98 |
| Preparative Example 2 | 0.886 | 4.5 | 2.41 | 1.32 | 0.37 | 0.49 |
| Preparative Example 3 | 0.890 | 3.0 | 2.42 | 1.33 | 0.40 | 0.53 |
| Preparative Example 4 | 0.879 | 13.2 | 2.41 | 1.31 | 0.69 | 0.90 |
| Comparative Preparative Example 1 | 0.875 | 3.0 | 2.50 | 2.04 | 0.66 | 1.34 |
| Comparative Preparative Example 2 | 0.873 | 0.1 | 2.45 | 1.33 | 0.72 | 0.96 |
| Comparative Preparative Example 3 | 0.877 | 53.3 | 2.40 | 1.31 | 0.33 | 0.43 |

MI: Melt flow index
PDI: Polydispersity index
Re: Reactivity ratio of ethylene monomer
Rc: Reactivity ratio of alpha olefin comonomer

Preparative Example 5

Preparation of Silane-Modified Ethylene-Alpha Olefin Copolymer

In a biaxial extruder (L/D=40 with a diameter of 27 mm, a retention time of 1 minute, and a pressure of 23 bars), the ethylene/1-octene copolymer prepared in Preparative Example 1 was polymerized with a vinyltrimethoxy silane monomer injected into a mixed bed of a 2,5-bis(tert-butylperoxy)-2,5-dimethylhexane (Lupersol 101) catalyst to prepare a vinyl silane-modified ethylene/1-octene copolymer. In this case, a content of the injected vinyltrimethoxy silane monomer corresponded to 4.5 parts by weight (0.45 kg/h) based on 100 parts by weight of the silane-modified ethylene/1-octene copolymer, and an amount of the 2,5-bis(tert-butylperoxy)-2,5-dimethylhexane (Lupersol 101) catalyst was 1/20 of the content of the vinyltrimethoxy silane monomer. A temperature of part of the biaxial extruder to which the ethylene/1-octene copolymer and the vinyltrimethoxy silane monomer were introduced was 50° C., a temperature of a part of the reactor into which nitrogen was injected was 210° C., and an exit temperature after the reaction was 140° C.

Preparative Example 6

Preparation of Silane-Modified Ethylene-Alpha Olefin Copolymer

A vinyl silane-modified ethylene/1-octene copolymer was prepared in the same manner as in Preparative Example 5, except that the ethylene/1-octene copolymer prepared in Preparative Example 2 was used as the ethylene-alpha olefin copolymer.

Preparative Example 7

Preparation of Silane-Modified Ethylene-Alpha Olefin Copolymer

A vinyl silane-modified ethylene/1-octene copolymer was prepared in the same manner as in Preparative Example 5, except that the vinyltrimethoxy silane was used at a content of 5.5 parts by weight (0.55 kg/h), based on 100 parts by weight of the silane-modified ethylene/1-octene copolymer.

Preparative Example 8

Preparation of Silane-Modified Ethylene-Alpha Olefin Copolymer

A vinyl silane-modified ethylene/1-octene copolymer was prepared in the same manner as in Preparative Example 5, except that the vinyltrimethoxy silane was used at a content of 8.0 parts by weight (0.8 kg/h), based on 100 parts by weight of the silane-modified ethylene/1-octene copolymer.

Comparative Preparative Example 4

Preparation of Silane-Modified Ethylene-Alpha Olefin Copolymer

A vinyl silane-modified ethylene/1-octene copolymer was prepared in the same manner as in Preparative Example 5, except that the ethylene/1-octene copolymer (ENGAGE 8452 manufactured by Dow Chemicals) of Preparative Example 3 was used as the ethylene-alpha olefin copolymer.

Example 1

80 g/min of the ethylene-alpha olefin copolymer prepared in Preparative Example 1, 20 g/min of the silane-modified ethylene-alpha olefin copolymer prepared in Preparative Example 5, 0.5 g/min of a benzotriazol-based ultraviolet absorber (Cyasorb UV-531) and 0.5 g/min of a hindered amine-based light stabilizer (Cyasorb THT-6460) were continuously introduced into a biaxial extruder (i.e., a twin screw extruder, L/D=40) to prepare a sheet having a thickness of 0.4 mm. Nitrogen was injected into the extruder, and a temperature of the extruder was in a range of 80 to 210° C.

Example 2

An encapsulant sheet having a thickness of 0.4 mm was prepared in the same manner as in Example 1, except that 20 g/min of the ethylene-alpha olefin copolymer prepared in Preparative Example 1 and 20 g/min of the silane-modified ethylene-alpha olefin copolymer prepared in Preparative Example 5 were used.

Example 3

80 g/min of the ethylene-alpha olefin copolymer prepared in Preparative Example 2, 20 g/min of the silane-modified ethylene-alpha olefin copolymer prepared in Preparative Example 6, 0.5 g/min of a benzotriazol-based ultraviolet absorber (Cyasorb UV-531) and 0.5 g/min of a hindered amine-based light stabilizer (Cyasorb THT-6460) were continuously introduced into a biaxial extruder (i.e., a twin screw extruder, L/D=40) to prepare a sheet having a thickness of 0.4 mm. Nitrogen was injected into the extruder, and a temperature of the extruder was in a range of 80 to 210° C.

Example 4

An encapsulant sheet having a thickness of 0.4 mm was prepared in the same manner as in Example 3, except that 20 g/min of the ethylene-alpha olefin copolymer prepared in Preparative Example 2 and 20 g/min of the silane-modified ethylene-alpha olefin copolymer prepared in Preparative Example 6 were used.

Example 5

80 g/min of the ethylene-alpha olefin copolymer prepared in Preparative Example 4, and 20 g/min of the silane-modified ethylene-alpha olefin copolymer prepared in Preparative Example 1 were continuously introduced into a biaxial extruder (L/D=40), without adding the other additives, to prepare a sheet having a thickness of 0.4 mm.

Example 6

An encapsulant sheet having a thickness of 0.4 mm was prepared in the same manner as in Example 1, except that 10 g/min of the ethylene-alpha olefin copolymer prepared in Preparative Example 3 was further added.

Example 7

An encapsulant sheet having a thickness of 0.4 mm was prepared in the same manner as in Example 3, except that 10 g/min of the ethylene-alpha olefin copolymer prepared in Preparative Example 3 was further added.

Comparative Example 1

80 g/min of the ethylene-alpha olefin copolymer of Preparative Example 3, and 20 g/min of the silane-modified ethylene-alpha olefin copolymer prepared in Preparative Example 4 were continuously introduced into a biaxial extruder (L/D=40), without adding the other additives, to prepare a sheet having a thickness of 0.4 mm. Nitrogen was injected into the extruder, and a temperature of the extruder was in a range of 80 to 210° C.

Comparative Example 2

80 g/min of the ethylene-alpha olefin copolymer of Preparative Example 2, and 20 g/min of the silane-modified ethylene-alpha olefin copolymer prepared in Preparative Example 1 were continuously introduced into a biaxial extruder (L/D=40) to prepare a sheet having a thickness of 0.4 mm. Nitrogen was injected into the extruder, and a temperature of the extruder was in a range of 80 to 210° C.

However, a melt fracture was caused on a surface of the sheet due to low MI during a molding process, which made it difficult to perform normal extrusion.

Comparative Example 3

80 g/min of the ethylene-alpha olefin copolymer of Preparative Example 3, and 20 g/min of the silane-modified ethylene-alpha olefin copolymer prepared in Preparative Example 1 were continuously introduced into a biaxial extruder (L/D=40), without adding the other additives, to prepare a sheet having a thickness of 0.4 mm.

Comparative Examples 4 to 5

80 g/min of the ethylene-alpha olefin copolymer prepared in Preparative Example 1, and 20 g/min of each of the silane-modified ethylene-alpha olefin copolymers prepared in Preparative Examples 7 and 8 were continuously introduced into a biaxial extruder (L/D=40), without adding the other additives, to prepare a sheet having a thickness of 0.4 mm.

Experimental Example 1

Light Transmission and Haze

Transparencies of the encapsulant sheets prepared in Examples 1 to 7 and Comparative Examples 1 to 5 were measured by calculating light transmission and haze using a reflectance-transmittance meter (HR-100 manufactured by Murakami), as follows. The results are listed in the following Table 3.

Light transmission(%)=100×total transmitted light quantity/incident light quantity Haze(%)=100×diffused transmitted light quantity/total transmitted light quantity Experimental Example 2

Peeling Strength

The encapsulant sheets as prepared in Examples 1 to 7 and Comparative Examples 1 to 5 were cut into pieces having a size of 5 cm×5 cm (width×length). Thereafter, one surface of each of the encapsulant sheets was attached to plate glass (thickness: 3 mm) as a light receiving substrate, and the other surface of each of the encapsulant sheets was attached to a supporting substrate. Then, the resulting laminate was pressed at a temperature of 150° C. for 15 minutes in a vacuum laminator for preparing a photovoltaic cell module to prepare a sample. After 20 minutes, a peeling strength of the laminate was measured using a tensile tester under the conditions (ASTM D903 conditions) such as a temperature of 25° C., a peeling speed of 50 mm/min, and a peeling angle of 90°. A laminated sheet in which a polyvinyl fluoride resin sheet having a thickness of 38 μm, aluminum foil with a thickness of 30 μm, and a polyvinyl fluoride resin sheet having a thickness of 38 μm were sequentially laminated was used as the supporting substrate. The measured peeling strengths are listed in the following Table 3.

Experimental Example 3

Heat Stability

Heat stabilities of the encapsulant sheets prepared in Examples 1 to 7 and Comparative Examples 1 to 5 were measured according to the ASTM G154 standard, by measuring a temperature at 5% weight loss in a thermogravimetric analysis (TGA). The results are listed in the following Table 3.

Experimental Example 4

Impact Resistance

The encapsulant sheets prepared in Examples 1 to 7 and Comparative Examples 1 to 5 were cut in a size of 5 cm×5 cm×100 μm (width×length×thickness) to prepare specimens. Thereafter, each of the specimens was positioned above a drop impact tester, and a drop impact strength of each specimen was measured according to the ASTM D1709A standard by allowing a weight with a diameter of 38 mm to free-fall on each specimen from a height of 0.66 m. The results are listed in the following Table 3.

TABLE 3

| | Light transmission (%) | Haze (%) | Peeling strength (N/15 mm) | Heat stability (° C.) | Drop impact strength (g) |
|---|---|---|---|---|---|
| Example 1 | 92.8 | 6 | 80 | 400 | 1,400 |
| Example 2 | 92.6 | 7 | 110 | 403 | 1,800 |
| Example 3 | 92.0 | 10 | 90 | 404 | 1,600 |
| Example 4 | 92.0 | 11 | 160 | 405 | 1,900 |
| Example 5 | 92.6 | 7 | 80 | 403 | 2,000 |
| Example 6 | 92.0 | 11 | 90 | 404 | 2,100 |
| Example 7 | 92.1 | 9 | 90 | 402 | 1,200 |
| Comparative Example 1 | 91.8 | 15 | 50 | 395 | 1,400 |
| Comparative Example 2 | 90.0 | 30 | — | — | — |
| Comparative Example 3 | 91.5 | 21 | 20 | 371 | 45 |
| Comparative Example 4 | 91.8 | 12 | 60 | 387 | 1,100 |
| Comparative Example 5 | 91.3 | 21 | 50 | 379 | 1,000 |

As listed in Table 3, it was confirmed that the encapsulant sheets prepared in Examples 1 to 7 according to the present application had excellent transparency, for example, a light transmission of 92% or more, and a haze of 14% or less, and also an excellent peeling strength of 60 N/15 mm or more, and exhibited an excellent heat stability, for example, a temperature at 5% weight loss of 400° C. or more as measured in the thermogravimetric analysis (TGA). On the other hand, it was confirmed that the encapsulant sheets prepared in Comparative Examples 1 to 3 not according to the present application had poor transparency, for example, a light transmission of 91.8% or less, and a haze of 15% or more. In the case of Comparative Example 2, the peeling strength and the drop impact strength of the encapsulant sheet could not be measured since it was impossible to prepare a specimen due to a melt fracture caused on a surface of the sheet, and a photovoltaic cell was broken during a module preparation procedure since protrusions were formed on a surface of the encapsulant sheet, and thus the encapsulant sheet had a poor effect of protecting photovoltaic cells as an encapsulant. Also, it was revealed that the encapsulant sheets prepared in Comparative Examples 1 and 3 had a poor peeling strength of 60 N/15 mm, and exhibited poor heat stability, for example, a temperature at 5% weight loss of 395° C. as measured in the thermogravimetric analysis (TGA).

Furthermore, it could be seen that the encapsulant sheets of Examples 6 and 7, which further included the ethylene-alpha olefin copolymer having a different molecular weight and density, had more excellent drop impact strength than the encapsulant sheets prepared in the other Examples and Comparative Examples.

Experimental Example 5

Ultraviolet Stability

The encapsulant sheets prepared in Example 1 and Comparative Example 1 were retained in an ultraviolet irradiator (QUV manufactured by Q-Lab) with an increasing retention time. Thereafter, yellow indexes of the encapsulant sheets according to the retention time were measured using a color measuring machine (Colorflex manufactured by HunterLab) with a light source C at an angle of 2° from an observer (ASTM D1925). In addition, elongations of the encapsulant sheets according to the retention time were measured according to the ASTM D882 standard.

The yellow indexes and elongations of the encapsulant sheets of Example 1 and Comparative Example 1 according to the retention time in the ultraviolet irradiator as measured thus are listed in the following Table 4.

TABLE 4

| Ultraviolet irradiation time (hour) | | 0 | 50 | 500 | 1,000 | 1,500 | 2,000 | 3,000 | 4,000 |
|---|---|---|---|---|---|---|---|---|---|
| Example 1 | Yellow index | 2.2 | 2.4 | 2.0 | 2.5 | 2.6 | 2.6 | 2.7 | 2.8 |
| | Elongation (%) | 920 | 850 | 900 | 880 | 850 | 810 | 830 | 800 |
| Comparative Example 1 | Yellow index | 2.0 | 2.5 | 2.2 | 2.5 | 2.6 | 2.8 | 2.9 | 3.0 |
| | Elongation (%) | 910 | 700 | 750 | 640 | 600 | 450 | 320 | F |

F (failed): could not be measured

As listed in Table 4, it was confirmed that the encapsulant sheet of Example 1 according to the present application had an elongation of 800% or more even when exposed to ultraviolet rays for 4,000 hours, but the encapsulant sheet of Comparative Example 1 had a rapidly reduced elongation with an increasing ultraviolet irradiation time, and the elongation was not measurable when the encapsulant sheet was exposed to ultraviolet rays for 4,000 hours.

As described above, it could be seen that the encapsulant sheets prepared in Examples 1 to 7 had excellent physical properties such as transparency, heat stability, peeling strength, and impact resistance, but the encapsulant sheets prepared in Comparative Examples 1 to 3 which did not fall within the exemplary embodiments of the present application had degraded transparency and heat stability, or exhibited reduced peeling strength and impact resistance.

While the invention has been shown and described with reference to certain exemplary embodiments thereof, it will be understood by those skilled in the art that various changes in form and details may be made therein without departing from the scope of the invention as defined by the appended claims.

[Description of References]

| | |
|---|---|
| 10: Wafer-based photovoltaic cell module | 20: Thin film type photovoltaic cell module |
| 11, 21: Light receiving substrate | 12, 22: Encapsulant layer |
| 12a: First layer | 12b: Second layer |
| 13, 23: Supporting substrate | 14, 24: Photovoltaic cell device |

The invention claimed is:

1. An encapsulation composition comprising an ethylene-alpha olefin copolymer which satisfies the following General Formula 1; and a silane-modified ethylene-alpha olefin copolymer, wherein the ethylene-alpha olefin copolymer satisfying the following General Formula 1 has a melt flow index (MI) of 0.2 to 50 g/10 min, wherein the silane-modified ethylene-alpha olefin copolymer is contained in an amount of 10 to 900 parts by weight, based on 100 parts by weight of the ethylene-alpha olefin copolymer satisfying General Formula 1:

$$Re \times Rc \leq 1.0 \quad \text{[General Formula 1]}$$

wherein Re represents kee/kec, and Rc represents kcc/kce, where kee represents a growth reaction rate constant when ethylene is added to a growing chain in which a terminal activating point is an ethylene monomer, kec represents a growth reaction rate constant when an alpha olefin comonomer is added to a growing chain in which a terminal activating point is an ethylene monomer, kcc represents a growth reaction rate constant when an alpha olefin comonomer is added to a growing chain in which a terminal activating point is an alpha olefin comonomer, and kce represents a growth reaction rate constant when an ethylene monomer is added to a growing chain in which a terminal activating point is an alpha olefin comonomer.

2. The encapsulation composition of claim 1, wherein the ethylene-alpha olefin copolymer satisfying General Formula 1 has a density of 0.85 to 0.91 g/cm$^3$.

3. The encapsulation composition of claim 1, wherein the ethylene-alpha olefin copolymer satisfying General Formula 1 has a polydispersity index (Mw/Mn) of 1.5 to 3.5.

4. The encapsulation composition of claim 1, wherein the silane-modified ethylene-alpha olefin copolymer is in the form of a copolymer in which silane monomers are included in the ethylene-alpha olefin copolymer satisfying General Formula 1 in a copolymerized form, or a graft copolymer in which silane monomers are engrafted into the ethylene-alpha olefin copolymer satisfying General Formula 1.

5. The encapsulation composition of claim 1, further comprising a second ethylene-alpha olefin copolymer that the molecular weight or density thereof is different from that of the ethylene-alpha olefin copolymer satisfying General Formula 1.

6. The encapsulation composition of claim 5, wherein the second ethylene-alpha olefin copolymer to be further comprised is contained in an amount of 10 to 1,000 parts by weight, based on 100 parts by weight of the encapsulation composition.

7. The encapsulation composition of claim 1, wherein the ethylene-alpha olefin copolymer satisfying General Formula 1 is an alternating copolymer.

8. The encapsulation composition of claim 1, further comprising at least one additive selected from the group consisting of a ultraviolet absorber, a light stabilizer, an antioxidant, glass fibers and glass bubbles.

9. An encapsulant comprising an encapsulation composition according to claim 1.

10. The encapsulant of claim 9, wherein the encapsulant has a sheet or film form.

11. The encapsulant of claim 10, wherein the encapsulant has a thickness of 0.2 to 0.8 mm.

12. A method of preparing an encapsulant comprising a step of forming an encapsulation composition according to claim 1 into a sheet or film form.

13. A photovoltaic cell module comprising:
a supporting substrate;
a photovoltaic cell or a photovoltaic cell array formed on the supporting substrate;
a light receiving substrate formed on the photovoltaic cell or the photovoltaic cell array; and
an encapsulating layer comprising an encapsulation composition according to claim 1, wherein the photovoltaic cell or the photovoltaic cell array is encapsulated between the supporting substrate and the light receiving substrate.

14. The photovoltaic cell module of claim 13, wherein the encapsulating layer is a single layer; or a multi-layer comprising a first layer configured to encapsulate the photovoltaic cell or the photovoltaic cell array in contact with the light receiving substrate and a second layer configured to encapsulate the photovoltaic cell or the photovoltaic cell array in contact with the supporting substrate.

15. The photovoltaic cell module of claim 13, wherein the encapsulating layer has a light transmission of 92% or more.

16. The photovoltaic cell module of claim 13, wherein the encapsulating layer has a haze of 14% or less.

17. The photovoltaic cell module of claim 13, wherein the encapsulating layer has a peeling strength of 60 N/15 mm or more.

* * * * *